(12) United States Patent
Arnold et al.

(10) Patent No.: US 8,470,711 B2
(45) Date of Patent: Jun. 25, 2013

(54) TONE INVERSION WITH PARTIAL UNDERLAYER ETCH FOR SEMICONDUCTOR DEVICE FORMATION

(75) Inventors: John C. Arnold, North Chatham, NY (US); Sean D. Burns, Hopewell Junction, NY (US); Matthew E. Colburn, Schenectady, NY (US); Steven J. Holmes, Guilderland, NY (US); Yunpeng Yin, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 212 days.

(21) Appl. No.: 12/952,248

(22) Filed: Nov. 23, 2010

(65) Prior Publication Data

US 2012/0126358 A1    May 24, 2012

(51) Int. Cl.
   *H01L 21/44*    (2006.01)
(52) U.S. Cl.
   USPC .............. 438/674; 438/703; 257/499
(58) Field of Classification Search
   USPC .......... 438/674, 703, 736; 257/499, E21.249, 257/E21.575
   See application file for complete search history.

(56) References Cited

U.S. PATENT DOCUMENTS

| 6,277,544 B1 * | 8/2001 | Singh et al. .................... 430/313 |
| 6,780,736 B1 | 8/2004 | Holmes et al. |
| 2011/0008968 A1 * | 1/2011 | Chang .......................... 438/703 |
| 2012/0068347 A1 * | 3/2012 | Isobayashi et al. ........... 257/773 |

* cited by examiner

*Primary Examiner* — Phuc Dang
(74) *Attorney, Agent, or Firm* — Cantor Colburn LLP; Yuanmin Cai (57) ABSTRACT

A method for tone inversion for integrated circuit fabrication includes providing a substrate with an underlayer on top of the substrate; creating a first pattern, the first pattern being partially etched into a portion of the underlayer such that a remaining portion of the underlayer is protected and forms a second pattern, and such that the first pattern does not expose the substrate located underneath the underlayer; covering the first pattern with a layer of image reverse material (IRM); and etching the second pattern into the substrate. A structure for tone inversion for integrated circuit fabrication includes a substrate; a partially etched underlayer comprising a first pattern located over the substrate, the first pattern being partially etched into a portion of the underlayer such that a remaining portion of the underlayer is protected and forms a second pattern, and such that the first pattern does not expose the substrate located underneath the underlayer; and an image reversal material (IRM) layer located over the partially etched underlayer.

12 Claims, 10 Drawing Sheets

TONE INVERSION WITH PARTIAL UNDERLAYER ETCH FOR SEMICONDUCTOR DEVICE FORMATION

FIELD

This disclosure relates generally to the field of integrated circuit (IC) processing, and more specifically to tone inversion in IC processing and patterning.

DESCRIPTION OF RELATED ART

The manufacturing of semiconductor devices is dependent upon the accurate replication of computer aided design (CAD) generated patterns onto the surface of the device substrate. The replication process is typically performed using lithographic processes, followed by a variety of subtractive (etch) and additive (deposition) processes. More particularly, a photolithography process typically includes applying a layer of photoresist material (i.e., a material that will react when exposed to light), and then selectively exposing portions of the photoresist to light or other ionizing radiation (e.g., ultraviolet, electron beams, X-rays, etc.), thereby changing the solubility of portions of the material. The resist is then developed by washing it with a developer solution, such as tetramethylammonium hydroxide (TMAH), thereby removing the non-irradiated (in a negative resist) or irradiated (in a positive resist) portions of the resist layer.

In the fabrication of complementary metal-oxide-semiconductor (CMOS) devices, several implant masks may be used to form appropriate source and drain areas on a chip. For p-type and n-type CMOS field effect transistor devices (NFETs and PFETs), some of the patters are complementary; that is, the pattern used for creating the p-type devices is the reverse of the pattern used for creating the n-type devices. More specifically, two separate masks are used in CMOS device processing in which either a positive or a negative resist is used to carry out two separate, complementary masking and implanting steps. For example, a first implant is formed by creating a first patterned (positive or negative) photoresist layer over a substrate. A first ion implantation is used to implant the exposed areas of the substrate with a first dopant material (e.g., a p-type material). Subsequently, the first patterned layer is stripped and a second patterned resist (of the same tone as the first resist) is used to expose the complementary regions of the substrate regions in order to carry out the complementary implantation with a second dopant material (e.g., an n-type material).

However, as devices become more miniaturized, the conventional methods for complementary device implantation are more susceptible to alignment errors as a result of the separate masking steps. Such alignment errors would limit the density and performance of the resulting devices. These alignment errors may include rotation errors, translation errors, overlap errors, and/or image size deviations. In turn, the possibility of incurring one or more of these errors results in the increase of the overall device error placement budget, thereby reducing valuable chip real estate that would otherwise be used for additional devices.

An image reversal process is a technique used in CMOS device processing, in which a combination of positive and negative resists is used for such steps as gate/line patterning or contact hole patterning. In one approach, a positive photoresist layer formed over a substrate is patterned to create an opening for a gate pattern or a line pattern. Subsequently, a negative resist is formed over the irradiated positive photoresist, including the formed opening. Then, the negative resist is recessed such that it remains open only in the area defined by the opening formed in the positive resist layer, while the remaining positive resist is removed. The remaining hardened negative resist defines the location for the gate or line pattern.

Although this type of image reversal process may be used to form certain types of semiconductor structures, it is not particularly suited for the type of complementary implant regions discussed above, due to intermixing between negative and positive photoresists during application. The intermixing may cause deformation of the underlying first resist pattern, impacting line width control and causing residual resist defects. Moreover, even if this approach were able to be adapted for complementary device implantation, there are still two separate lithography steps needed in accomplishing the image reversal.

Another existing approach is to utilize spun-on glass (SOG) over photoresist for image reversal purposes. However, SOG is an oxide material that is typically removed using harsh solvents such as dilute or buffered hydrofluoric acid (HF), which tends to cause damage to the other oxide layers on the device substrate.

A significant part of the cost of an integrated circuit chip is contained in the lithography processes used to pattern the implant mask levels, especially at relatively small dimensions. As such it is desirable to be able to implement image reversal for applications such as CMOS device implantation, but without the added lithography steps needed heretofore, or the risk of device damage from removing SOG, to accomplish the image reversal.

SUMMARY

In one aspect, a method for tone inversion for integrated circuit fabrication includes providing a substrate with an underlayer on top of the substrate; creating a first pattern, the first pattern being partially etched into a portion of the underlayer such that a remaining portion of the underlayer is protected and forms a second pattern, and such that the first pattern does not expose the substrate located underneath the underlayer; covering the first pattern with a layer of image reverse material (IRM); and etching the second pattern into the substrate.

In another aspect, a structure for tone inversion for integrated circuit fabrication includes a substrate; a partially etched underlayer comprising a first pattern located over the substrate, the first pattern being partially etched into a portion of the underlayer such that a remaining portion of the underlayer is protected and forms a second pattern, and such that the first pattern does not expose the substrate located underneath the underlayer; and an image reversal material (IRM) layer located over the partially etched underlayer.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a method for tone inversion with partial underlayer etch are provided, with exemplary embodiments being discussed below in detail. A technique for relatively small dimension pitch patterning and image reversal is brightfield imaging with a tone inversion process. Tone inversion may involve two separate resist exposures to double the pitch in some embodiments, followed by application of an etch selective, tone inversion overcoat material, also referred to as an image reverse material (IRM), which may be applied directly on patterned photoresist to transfer a brightfield image into the reverse tone. The IRM is then etched back after application. However, a tone inversion process may be susceptible to large critical dimension (CD) variance, due to uneven resist application, resist profile, and varying resist height. By including an underlayer under the resist, and performing a partial etch of the underlayer using the resist as a mask prior to application of the IRM, the resulting partially etched underlayer structure may be relatively square and uniform, and which may result in a uniform tone inversion etch step with low CD variance. The tone inversion process is also made significantly more robust by use of the partial underlayer etch. Partial etching of the underlayer may also reduce or eliminates CD variance in the finished IC that may result from photoresist sidewall profile or resist height.

The tone inversion process may also include an antireflective coating (ARC) located over the underlayer. In some embodiments, the ARC may be left intact during IRM application. However, with an intact ARC layer, the IRM etchback budget may be different in dense line regions of the IC versus in open areas, which may lead to punchthrough of the IRM during etching and a limited IRM etchback process window. In other embodiments, the ARC may be fully or partially removed before application of the IRM coating. Partial or full ARC removal may further enhance the process window for the IRM etchback.

Figure 1:
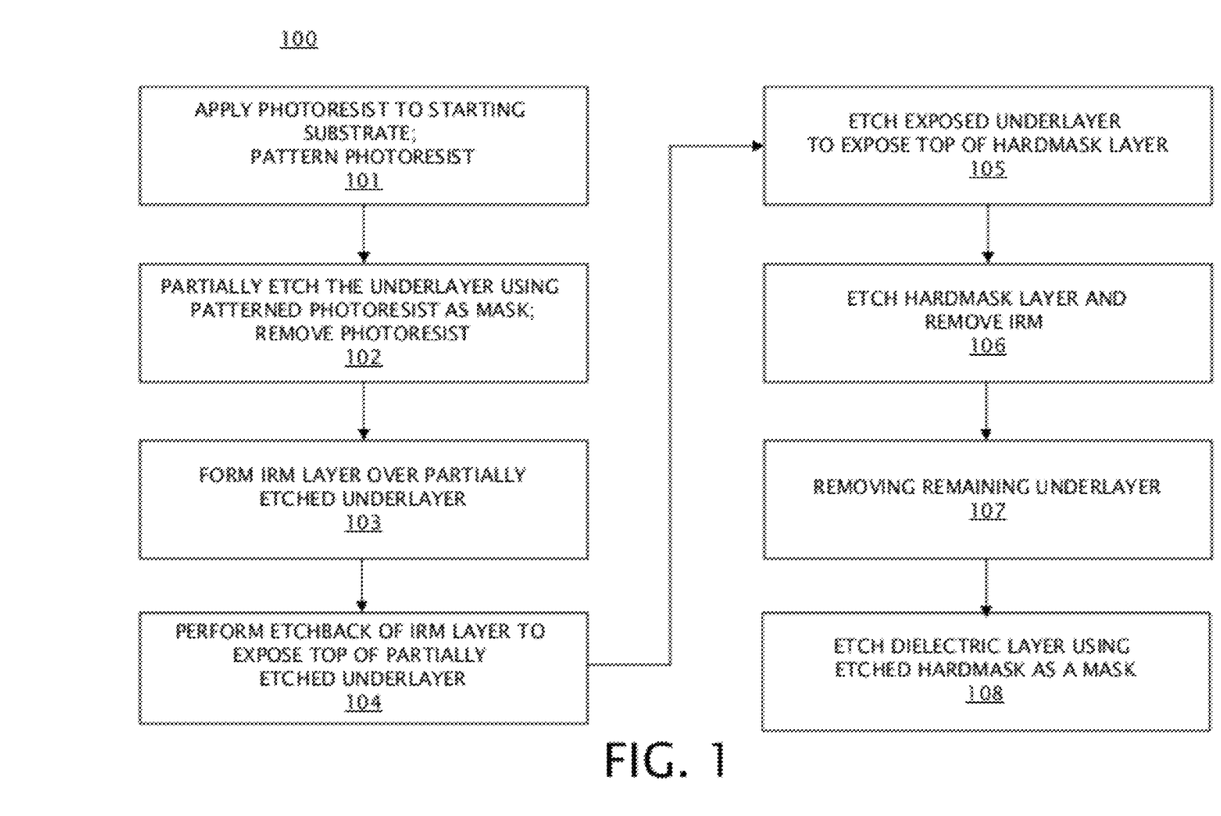
FIG. 1 illustrates an embodiment of a method for tone inversion with partial underlayer etch.
Figure 2:
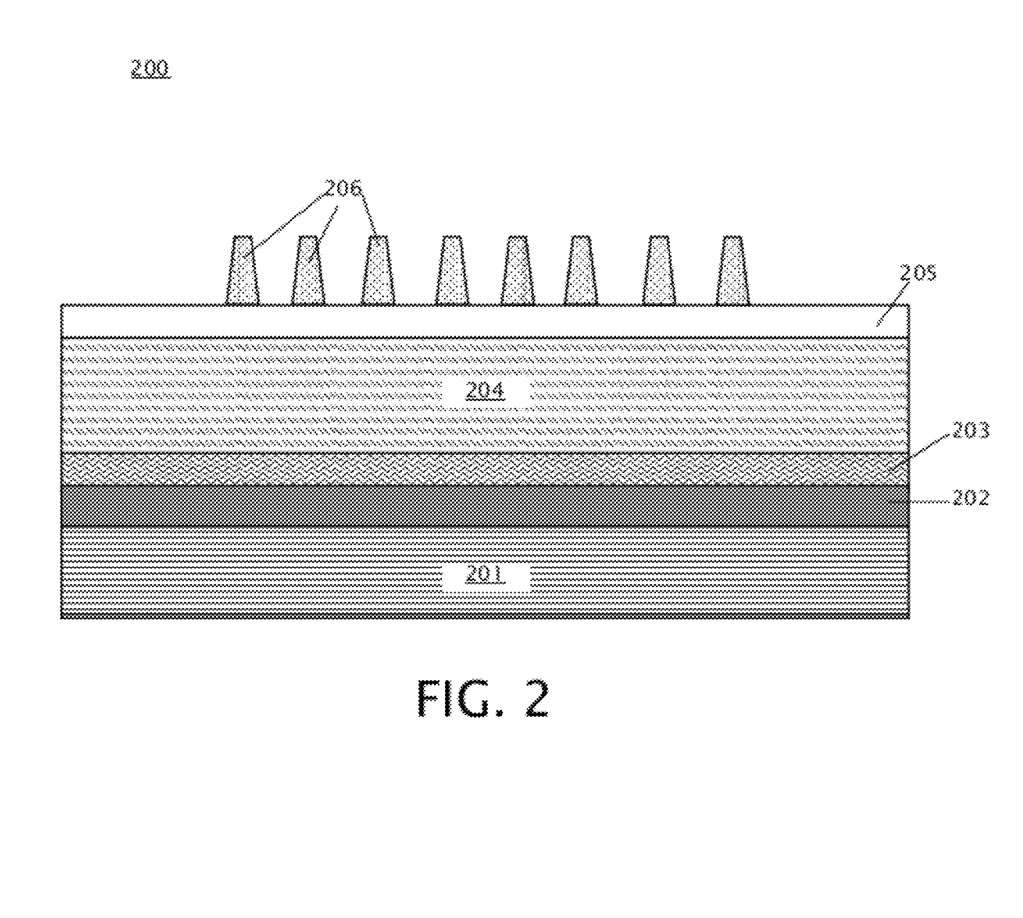
FIG. 2 illustrates an embodiment of a starting substrate after application and patterning of photoresist.

FIG. 1 illustrates an embodiment of a method for tone inversion with partial underlayer etch. FIG. 1 is discussed with reference to FIGS. 2-11. In block 101, photoresist is applied to a surface of a starting substrate that includes a bottom dielectric 201, dielectric cap 202, hardmask layer 203, underlayer 204, and ARC 205, and the photoresist is patterned, resulting in patterned photoresist 206 as shown in structure 200 of FIG. 2. The bottom dielectric 201 may be any appropriate dielectric material. Dielectric cap 202 may include silicon oxide formed from a tetraethyl orthosilicate (TEOS) precursor in some embodiments, and may have a thickness from about 20 nanometers (nm) to about 200 nm in some embodiments. Hardmask 203 may include a metal such as titanium nitride (TiN) or boron nitride (BN), or a metal oxide, and have a thickness from about 20 nm to about 70 nm in some embodiments. Underlayer 204 may include an organic material such as a polymer in some embodiments, and may have a thickness from about 50 nm to about 400 nm in some embodiments. In some embodiments, underlayer 204 may include a bottom layer of a first underlayer material, and a top layer of a second underlayer material; the interface between the two underlayer materials may act as an etch stop during the partial underlayer etch (discussed below with respect to block 102). ARC 205 acts to minimize the light reflection during lithography, and also acts as a masking layer for the partial etch of underlayer 204 in block 102. ARC 205 may include silicon (Si) in some embodiments, and may have a thickness from about 20 nm to about 100 nm in some embodiments. The photoresist 206 may be any appropriate type(s) of photoresist, and may be applied using any appropriate method(s), depending on the device being formed. The photoresist 206 may be single, double, or triple patterned, and may have a thickness from about 30 nm to about 150 nm in various embodiments. Photoresist 206 may include an argon fluoride (ArF) single exposure resist, a double exposure resist (i.e. thermal cure system), or an extreme ultraviolet (EUV) resist formed by an optical process in various embodiments.

Figure 3:
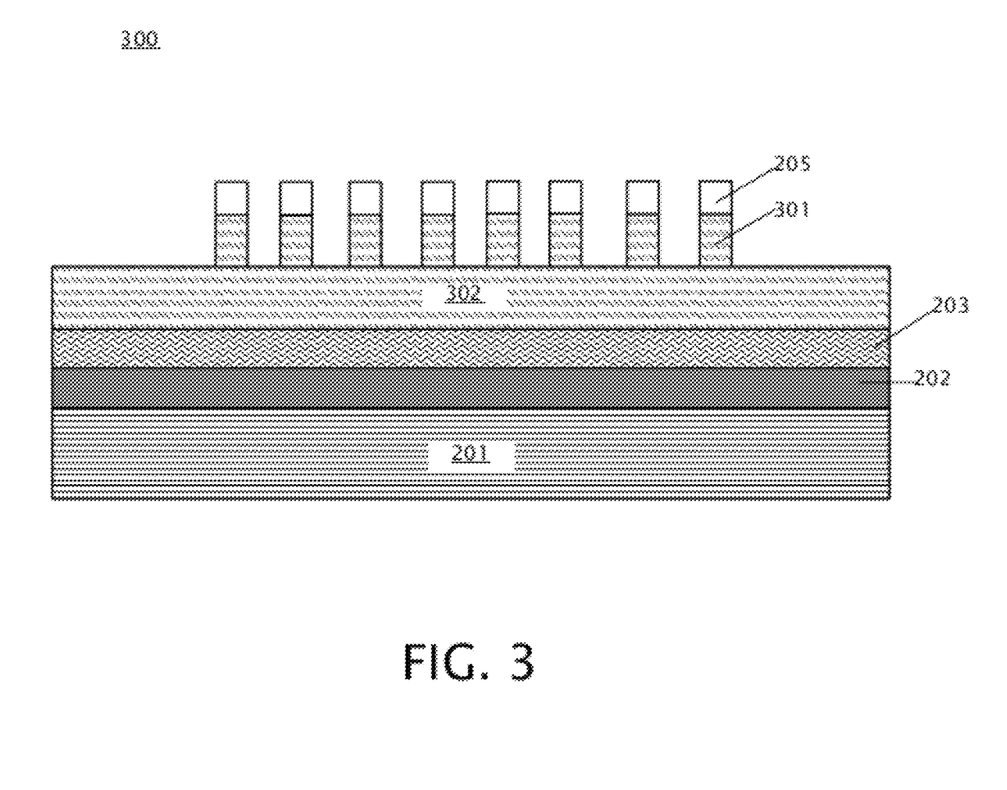
FIG. 3 illustrates an embodiment of the device of FIG. 2 after partial etching of the underlayer and removing the photoresist.

In block 102, underlayer 204 is partially etched, with ARC layer 205 acting as a mask during the partial etching, as shown in FIG. 3, resulting in etched underlayer 301 and bottom underlayer 302. The partial etch of underlayer 204 does not expose hardmask 203. Photoresist layer 206 is also etched away during the partial etching of underlayer 204. In some embodiments, etched underlayer 301 and bottom underlayer 302 comprise the same material. In other embodiments in which underlayer 204 includes a bottom layer of a first underlayer material and a top layer of a second underlayer material, the bottom layer forms bottom underlayer 302, and the top layer forms etched underlayer 301. The etch chemistry for the underlayer etch of block 102 is selective against the material comprising the bottom underlayer 302 in such an embodiment. The interface between the two underlayer materials may act as an etch stop during the partial underlayer etching. The first underlayer may include an organic material such as a polymer in some embodiments; and the second underlayer may be a metal hardmask layer, such as TiN, with a thickness ranging from a few nm to 50 nm, in some embodiments.

Figure 4:
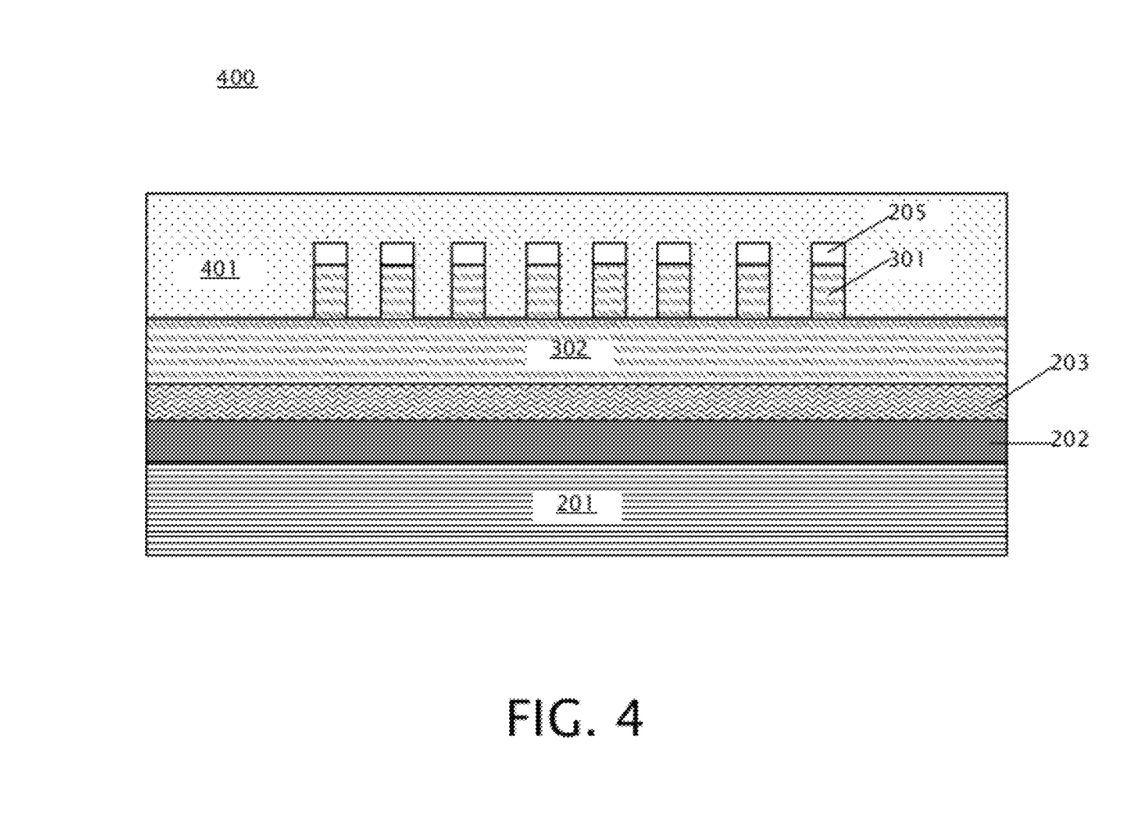
FIG. 4 illustrates an embodiment of the device of FIG. 3 after formation of an image reverse material layer over an antireflective coating layer and the partially etched underlayer.
Figure 5:
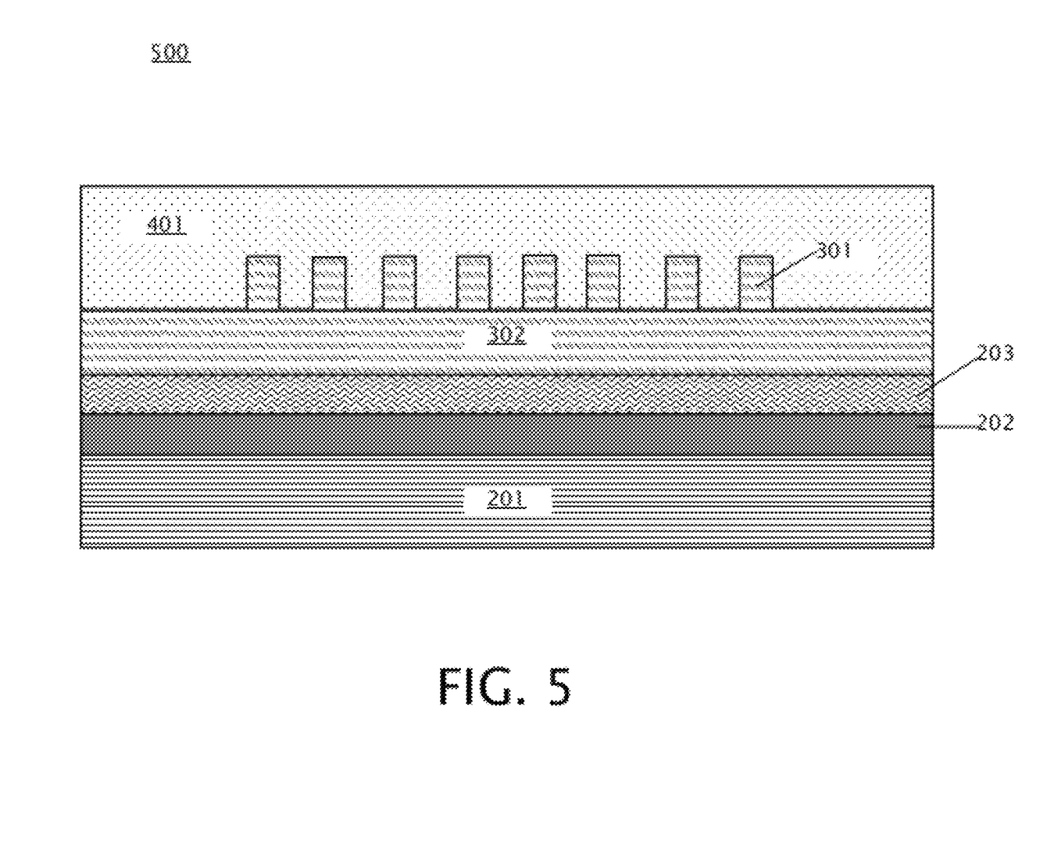
FIG. 5 illustrates an embodiment of the device of FIG. 3 after removal of an antireflective coating layer and formation of an image reversal material layer over the partially etched underlayer.

In block 103, an image reversal material (IRM) layer 401 is formed over the partially etched underlayer 301/302. The IRM layer 401 may be formed by spin-coating, and include any material that is etch selective to the material(s) comprising partially etched underlayer 301/302. In some embodiments, the IRM layer 401 may be a silicon-containing overcoat layer, which may comprise (but is not limited to) a silicon-containing polymer. The polymer may be a siloxane, silsesquioxane, hydrogen silsequioxane, or other related materials in various embodiments. In some embodiments, the etched ARC 205 of FIG. 3 may not be removed, or may be partially removed, before formation of IRM layer 401, as shown in FIG. 4. FIG. 4 illustrates an embodiment of the device of FIG. 3 after partial removal of ARC 205 and formation of IRM layer 401. In other embodiments, the etched ARC 205 of FIG. 3 may be fully removed before formation of IRM layer 401, as shown in FIG. 5. FIG. 5 illustrates an embodiment of the device of FIG. 3 after full removal of ARC 205 and formation of IRM layer 401. Partial or full ARC removal before application of IRM layer 401 may decrease the likelihood of IRM punchthrough in the open field region during the IRM etchback, which is discussed below with respect to block 104.

Figure 6:
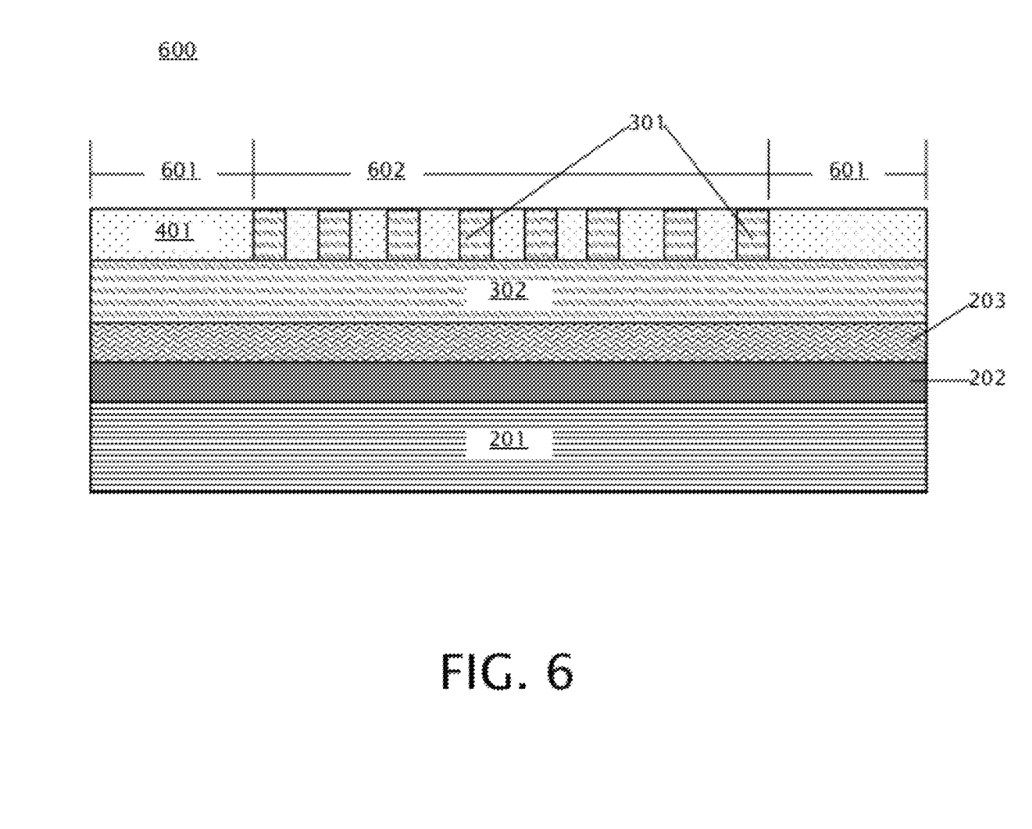
FIG. 6 illustrates an embodiment of either the devices of FIG. 4 or 5 after etchback of the image reverse material layer.

In block 104, etchback of IRM layer 401 is performed to expose the top of etched underlayer 301, as shown in FIG. 6. The etch of block 104 may be a plasma etch, and may be selected such that the IRM 401 is etched selective to the material that comprises partially etched underlayer 301/302. In embodiments in which ARC 205 was fully removed before formation of IRM layer 401 (such as FIG. 5), only etchback of IRM layer 401 is necessary in block 104. In embodiments in which ARC 205 is not removed or partially removed before formation of IRM layer 401 (such as FIG. 4), any ARC 205 located on etched underlayer 301 is removed during the etchback of IRM layer 401 in block 104. In such an embodiment, both the IRM 401 that is located above the etched underlayer 301 and the ARC 205 need to be etched away in block 104 in order to reverse patterns in the dense line region (indicated by line 602); however, in the open field region (indicated by lines 601), only the IRM coating layer 401 needs to be etched. Therefore, without full or partial removal of ARC 205 in the dense line region 602 prior to etchback in block 104, the risk of punchthrough of IRM 401 in the open field region 601 during the etch of block 104, exposing bottom underlayer 302 or hardmask layer 203, may be increased.

Figure 7:
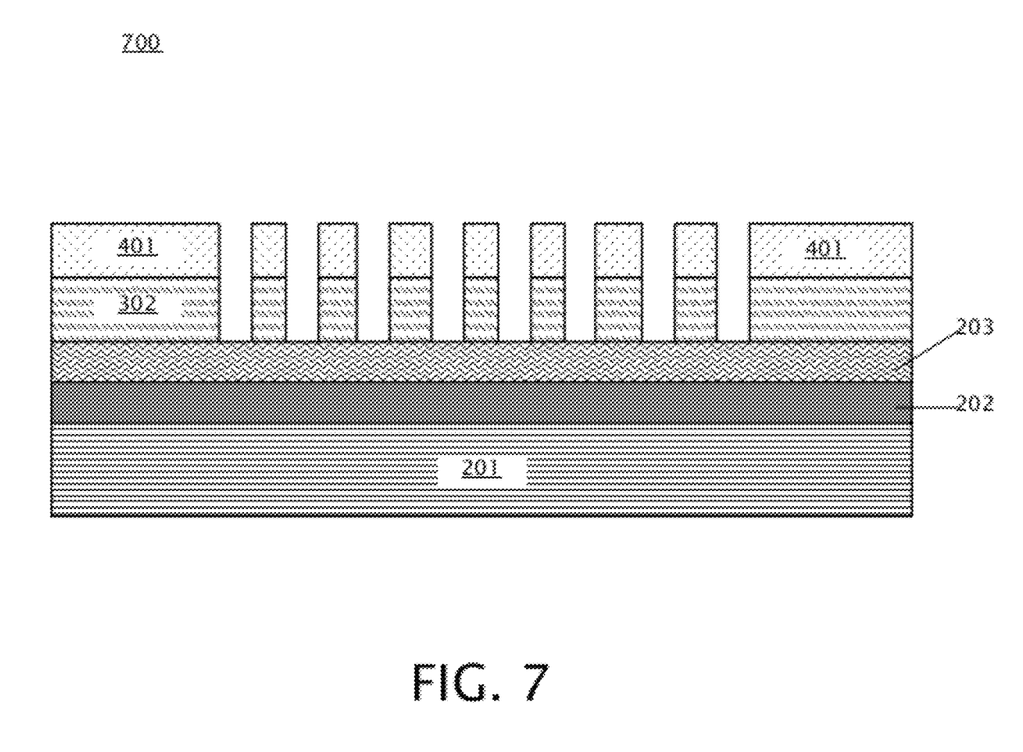
FIG. 7 illustrates an embodiment of the device of FIG. 6 after etching the underlayer down to the hardmask layer.

Then, in block 105, the etched underlayer 301 and bottom underlayer 302 are etched down to expose hardmask layer 203, resulting in structure 700 as shown in FIG. 7. The etchedback IRM layer 401 acts as a mask during the etching of the partially etched underlayer 301/302 that is performed in block 105.

Figure 8:
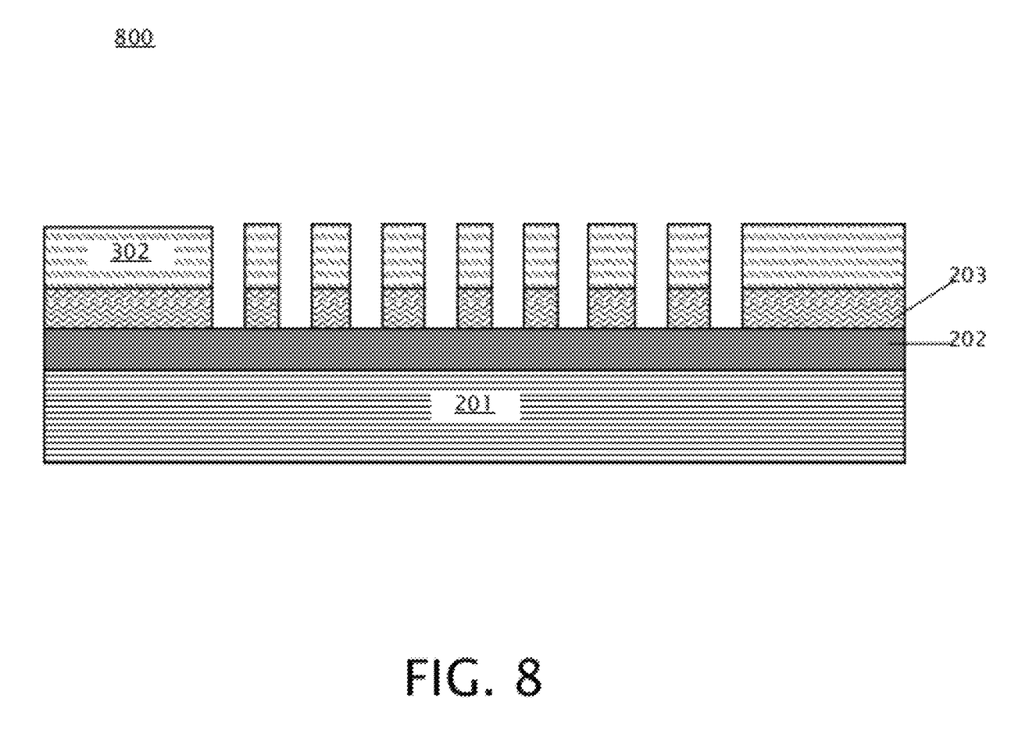
FIG. 8 illustrates an embodiment of the device of FIG. 7 after etching the hardmask layer.

In block 106, the hardmask layer 203 is etched using bottom underlayer 302 as a mask. The etch of hardmask layer 203 may include a breakthrough step and an etching step in some embodiments. The breakthrough step may include an oxide breakthrough plasma etch that may be used to punch through the oxidized top portion of hardmask layer 203 in some embodiments. After the breakthrough of hardmask 203 is completed, hardmask 203 is etched, resulting in structure 800 as shown in FIG. 8. IRM layer 401 is also removed in block 106. The IRM layer 401 may be fully removed before hardmask layer 203 is etched, or the IRM layer 401 may be thinned down before the etch of hardmask layer 203 in some embodiments, so that the thinned IRM layer 401 is removed during the etch of hardmask layer 203 in other embodiments.

Figure 9:
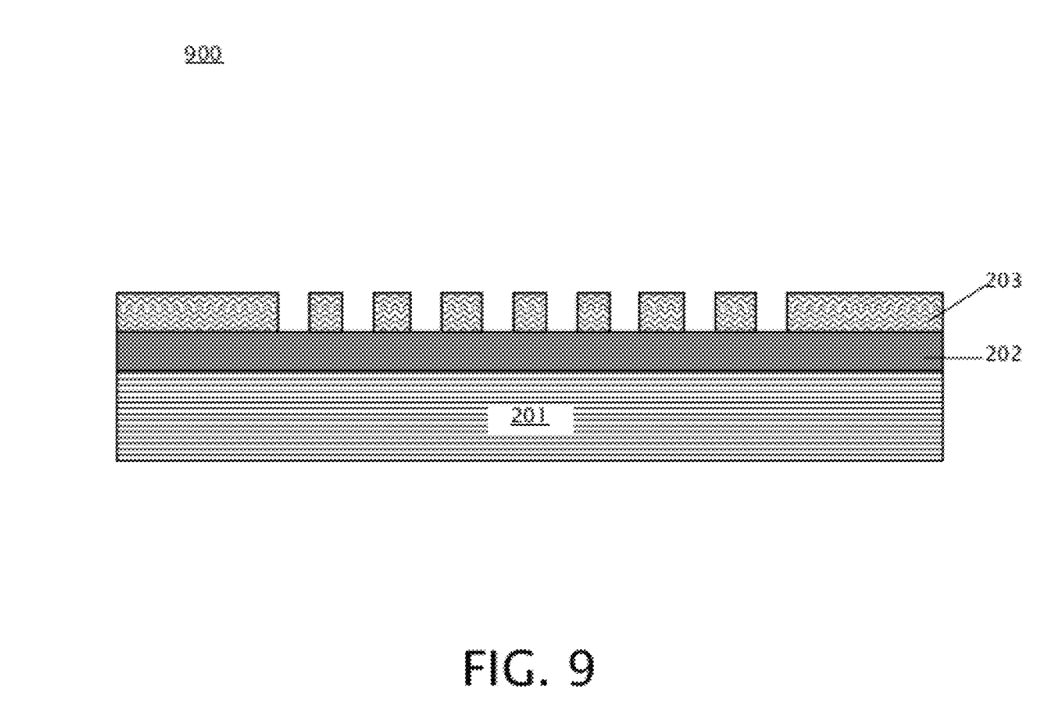
FIG. 9 illustrates an embodiment of the device of FIG. 8 after removal of the remaining image reverse material layer.
Figure 10:
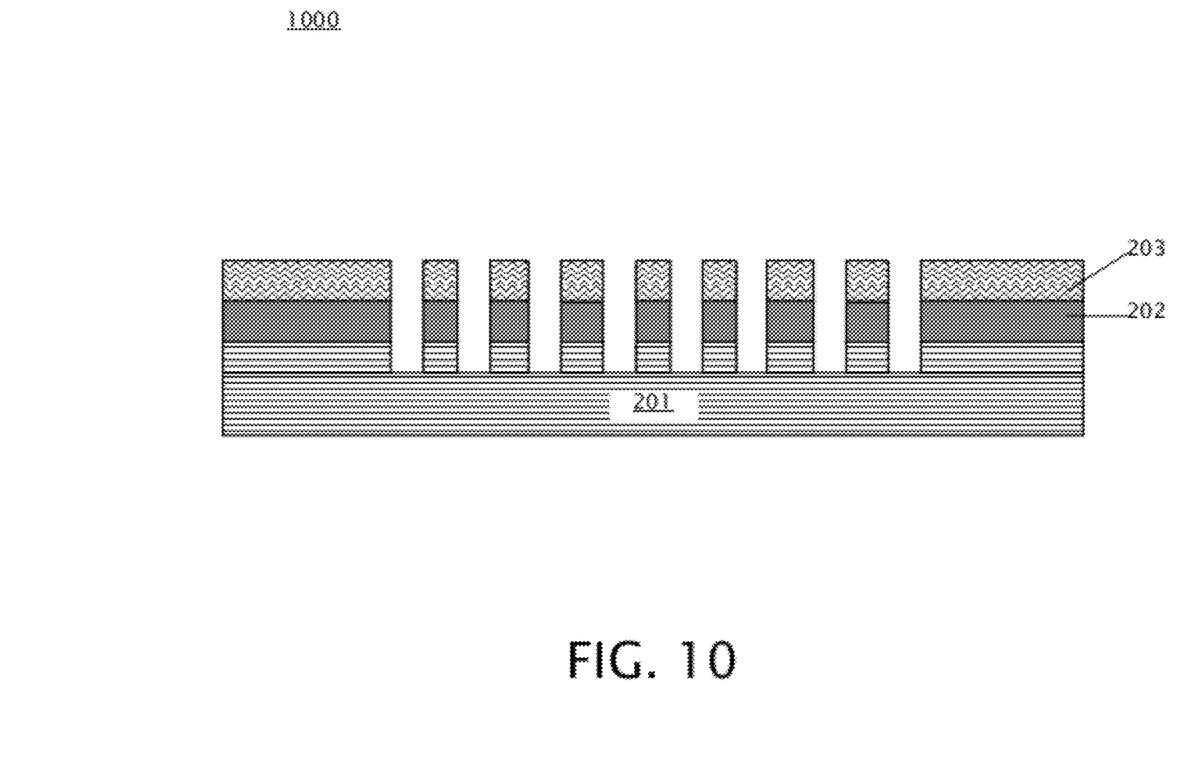
FIG. 10 illustrates an embodiment of the device of FIG. 9 after removal of the remaining underlayer.

After etching of hardmask layer 203 and removal of IRM layer 401 in block 106, in block 107 the bottom underlayer 302 is removed, resulting in the structure shown in FIG. 9. Then, in block 108, the dielectric cap 202 and dielectric layer 201 are etched with hardmask layer 203 acting as a mask, resulting in device 1000 shown in FIG. 10. The etched dielectric layer 201 of device 1000 may then be used to fabricate a metal layer for an IC. To form a finished IC, any appropriate additional processing may be performed using a device that is formed using method 100 (such as device 1000), including back-end-of-line (BEOL) integration for metal interconnects, which may require via-trench dual damascene structures. Method 100 may be integrated with any appropriate via process schemes to form via-trench dual damascene structures that may be used to form metal interconnects.

The technical effects and benefits of exemplary embodiments include prevention of IRM punchthrough during IRM etchback and increased CD uniformity in a finished IC.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for tone inversion for integrated circuit fabrication, the method comprising:
   providing a substrate with an underlayer on top of the substrate;
   forming an antireflective coating (ARC) on top of the underlayer;
   creating a first pattern, the first pattern being partially etched into a portion of the underlayer such that a remaining portion of the underlayer is protected and forms a second pattern, and such that the first pattern does not expose the substrate located underneath the underlayer, and wherein creating the first pattern comprises:
      applying photoresist on a top surface of the ARC;
      patterning the photoresist;
      partially etching the underlayer using the patterned photoresist as a mask, wherein the partial etching of the underlayer does not expose the substrate; and
      removing the photoresist;
   fully removing the ARC from the underlayer after removing the photoresist;
   covering the first pattern with a layer of image reverse material (IRM) after fully removing the ARC; and
   etching the second pattern into the substrate.

2. The method of claim 1, wherein the ARC comprises silicon.

3. The method of claim 1, wherein the IRM layer comprises a silicon-containing polymer.

4. The method of claim 1, wherein the underlayer comprises an organic material.

5. The method of claim 1, wherein the underlayer comprises a polymer.

6. A method for tone inversion for integrated circuit fabrication, the method comprising:
   providing a substrate with an underlayer on top of the substrate;
   forming an antireflective coating (ARC) on top of the underlayer;
   creating a first pattern, the first pattern being partially etched into a portion of the underlayer such that a remaining portion of the underlayer is protected and forms a second pattern, and such that the first pattern does not expose the substrate located underneath the underlayer, and wherein creating the first pattern comprises:
  applying photoresist on a top surface of the ARC;
  patterning the photoresist;
  partially etching the underlayer using the patterned photoresist as a mask, wherein the partial etching of the underlayer does not expose the substrate; and
  removing the photoresist;
partially removing the ARC from the underlayer after removing the photoresist;
covering the first pattern with a layer of image reverse material (IRM) after partially removing the ARC from the underlayer; and
etching the second pattern into the substrate, wherein a remaining portion of the ARC is removed from the underlayer during etching of the second pattern into the substrate.

7. A method for tone inversion for integrated circuit fabrication, the method comprising:
  providing a substrate with an underlayer on top of the substrate;
  creating a first pattern, the first pattern being partially etched into a portion of the underlayer such that a remaining portion of the underlayer is protected and forms a second pattern, and such that the first pattern does not expose the substrate located underneath the underlayer;
  covering the first pattern with a layer of image reverse material (IRM); and
  etching the second pattern into the substrate, wherein etching the second pattern into the substrate comprises:
    performing etchback of the IRM layer to expose a top portion of the underlayer;
    etching the underlayer to expose the substrate using the etchedback IRM layer as a mask, wherein the substrate comprises a hardmask over a dielectric layer, and wherein etching the exposed substrate using the partially etched underlayer as a mask comprises:
      etching the hardmask using the etched underlayer as a mask; and
      etching the dielectric layer through the etched hardmask;
    etching the exposed substrate using the etched underlayer as a mask; and
    forming a metal layer for the integrated circuit in the etched dielectric layer.

8. The method of claim 7, wherein the hardmask comprises a metal.

9. The method of claim 7, wherein the hardmask comprises one of titanium nitride and boron nitride.

10. The method of claim 7, further comprising removing a remaining portion of the IRM layer during the etching of the hardmask.

11. The method of claim 7, further comprising removing a remaining portion of the underlayer from the hardmask after etching the hardmask.

12. A method for tone inversion for integrated circuit fabrication, the method comprising:
  providing a substrate with an underlayer on top of the substrate wherein the underlayer comprises a top underlayer material layer over a bottom underlayer material layer;
  creating a first pattern, the first pattern being partially etched into a portion of the underlayer such that a remaining portion of the underlayer is protected and forms a second pattern such that the first pattern does not expose the substrate located underneath the underlayer, and wherein an interface between the top underlayer material layer and the bottom underlayer material layer acts as an etch stop during the partial etching of the first pattern into the underlayer;
  covering the first pattern with a layer of image reverse material (IRM); and
  etching the second pattern into the substrate.

* * * * *